United States Patent [19]

Hsu

[11] 4,445,270

[45] May 1, 1984

[54] LOW RESISTANCE CONTACT FOR HIGH DENSITY INTEGRATED CIRCUIT

[75] Inventor: Sheng T. Hsu, Lawrenceville, N.J.

[73] Assignee: RCA Corporation, New York, N.Y.

[21] Appl. No.: 390,782

[22] Filed: Jun. 21, 1982

[51] Int. Cl.³ .................... H01L 21/265; B01J 17/00
[52] U.S. Cl. ................... 29/576 B; 29/571; 29/578; 148/1.5; 148/187; 357/91
[58] Field of Search ............ 29/576 B, 571, 578; 148/1.5, 187; 357/91

[56] References Cited

U.S. PATENT DOCUMENTS

| 4,102,733 | 7/1978 | Dela moneda | 29/578 |
| 4,114,256 | 9/1978 | Thibault et al. | 29/571 |
| 4,204,894 | 5/1980 | Komeda et al. | 148/188 |
| 4,305,760 | 12/1981 | Trudel | 148/1.5 |
| 4,306,915 | 12/1981 | Shiba | 148/1.5 |
| 4,371,403 | 2/1983 | Ikubo et al. | 148/1.5 |
| 4,404,733 | 10/1983 | Sasaki | 29/571 |

Primary Examiner—Upendra Roy
Attorney, Agent, or Firm—Birgit E. Morris; Donald S. Cohen; Lawrence P. Benjamin

[57] ABSTRACT

A novel process for fabricating low resistance contacts for high density integrated circuits is described wherein during the initial processing of the device, after a scaled MOSFET is formed, contact openings, having vertical walls with respect to the underlying substrate, are provided. An apertured masking layer, having apertures which provide an open are a somewhat larger than the original contact opening, is formed on the structure after which, the structure is subjected to a high energy deep implant step followed by a low energy, shallow, supplemental implant step. The high energy implant serves to provide the device with a deep junction at the contact area to minimize spiking and, by reason of the shallow implant, good ohmic contact may be made. Since the oxide surrounding the contact opening is also implanted, there is provided means for tapering the edges of the contact opening.

7 Claims, 4 Drawing Figures

LOW RESISTANCE CONTACT FOR HIGH DENSITY INTEGRATED CIRCUIT

FIELD OF THE INVENTION

This invention relates, in general, to semiconductor devices and, more particularly, to a novel method of forming high packing density, very large scale integrated devices.

BACKGROUND OF THE INVENTION

It has long been recognized that as the packing density of integrated circuits is increased, the dimensions of the individual elements must be reduced to achieve the high packing density. Thus, the area occupied by each of the drain regions, the source regions, the gate members (and associated channel regions), as well as the contact regions and interconnects must also be significantly reduced in order to achieve the required density. Further, it has been found that, in order to have metal-oxide-semiconductor (MOS) devices operate at high speeds, the high packing density requires that the devices be scaled.

A scaled device, generally, may be defined as a MOS field effect transistor (MOSFET) having a shallow source and drain diffused region, i.e. diffused regions that are less than about 0.6 $\mu m$ (microns) deep and a small geometry channel length less than about 0.3 micron and probably as close to 1.0 micron or less as possible. Thus, with shallow diffused regions, any process step requiring a contact to be made directly to the diffused region must be done so with extreme care as the shallow nature of the diffused region will allow the contact to spike through the region into the underlying substrate. Additionally, because of the shallow diffused regions, care must be taken to prevent any process step from removing silicon from the diffused region since any excessive thinning of the diffused region will also allow the subsequent metal contact to spike through more readily.

SUMMARY OF THE INVENTION

A novel process is described for forming a contact opening which may be used as a diffused contact. In the subject application, a scaled MOSFET device is first formed in a body of single crystalline silicon after which a contact opening is formed, the contact opening having essentially vertical walls with respect to the underlying substrate. The process then includes forming an apertured masking layer having apertures aligned with the contact openings and which provide an open area somewhat larger than the original contact opening and thereafter subjecting the open area and contact opening to an implant step. The implanted ions provide the device with a deep junction at the contact area and, by reason of the fact that the oxide surrounding the contact opening is also implanted, there is provided means for tapering the edges of the contact opening to provide smooth transition for the subsequent metallization.

DETAILED DESCRIPTION OF THE INVENTION

In the following description of the invention, it should be noted that similar elements in each of the various FIGURES will be similarly numbered. Further, while my process will be described in terms of processing bulk silicon devices, it should be apparent to those skilled in the art that, with appropriate changes, my invention has equal applicability to devices made on an insulating substrate. Thus, the body of silicon in which the transistor is formed may be an island of monocrystalline silicon on a sapphire substrate (SOS) which substrate is manufactured with the proper crystallographic orientation. While sapphire is used, by way of example, it should be understood that the insulating substrate may also be either spinel or monocrystalline aluminum oxide.

Figure 1:
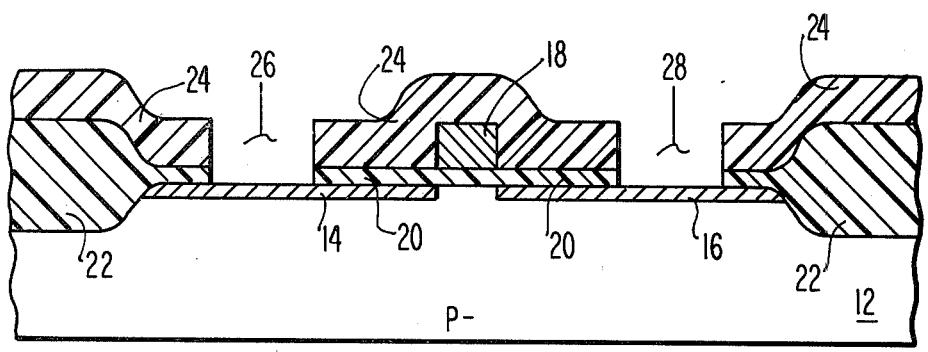
FIGS. 1-4, inclusive, represent sectional views of the novel process of the subject invention, indicating the various stages of processing.

Referring now to FIG. 1 there is shown the device as prepared prior to starting the process of my invention. The structure shown has a substrate of monocrystalline silicon 12 in which drain region 14 and source region 16 have been formed. These diffused regions may be of the order of about 1000-2000 angstroms deep and, since substrate 12 is formed to have P-conductivity type, drain and source regions 14 and 16 are provided with appropriate conductivity modifiers (such as phosphorus) to form N+ regions therein. The structure is also provided with a gate member 18 separated and insulated from substrate 12 by means of gate oxide layer 20. This gate oxide layer 20 extends out to and becomes part of field oxide regions 22 in order to insulate the device shown from the next adjacent devices. Layer 24 is a chemically vapor deposited (CVD) oxide which is deposited initially to cover all of field oxide 22, gate oxide 20 and gate 18. Also shown in the structure, at the initial stages of my novel process, are contact openings 26 and 28 through which respective contacts will be made to drain region 14 and source region 16.

Figure 2:
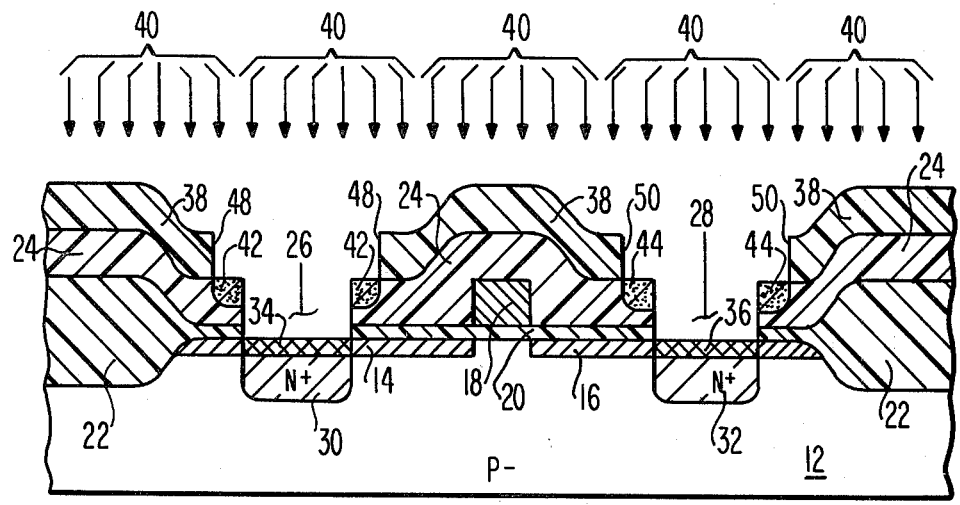

Referring now to FIG. 2, there is shown the initial stages of my novel process wherein the structure of FIG. 1 is first provided with a layer of apertured photoresist 38 wherein apertures 48 and 50 are in corresponding registry and aligned with contact openings 26 and 28 respectively. However, as shown, apertures 48 and 50 in photoresist layer 38 are somewhat larger than contact openings 26 and 28 in order to expose portions 42 and 44 of CVD silicon dioxide layer 24. This photoresist layer 38 is used as a mask for the subsequent deep source and drain junction contact implantation as indicated by arrows 40. In this particular configuration, a high energy deep phosphorus implantation step is performed wherein phosphorus is implanted using an energy level of about 150 KeV at a dose of about $4 \times 10^{15}$ ions/cm$^2$. This will produce implanted areas 30 and 32 which represent the deep implant portions of the drain and source contacts, respectively. The high energy implant is then followed with a supplemental phosphorus implant at an energy level ranging from about 75-80 KeV and a dose of about $3 \times 10^{15}$ ions/cm$^2$ in order to increase the surface doping concentration at areas 34 and 36 and thus further reduce the metal-to-semiconductor contact resistance. Simultaneous with both the implantation of contact areas 30 and 32, and the supplemental implantation of areas 34 and 36, the exposed portions 42 and 44 of CVD oxide layer 24 will also be implanted by each of the implanting steps.

It should be herein noted that if it is desired to produce a CMOS integrated circuit, additional masking steps are required. For example, after drain and source regions 14 and 16 are implanted in order to form an N channel device, the N channel area will then have to be masked and an N well formed at another portion of the substrate 12 (not shown). After the formation of the N well, shallow P type diffused regions, similar to those of drain and source regions 14 and 16, respectively, will be formed in the N well using boron as the conductivity modifier. Subsequently, deep implanted areas (similar to areas 30 and 32) and shallow implanted areas (similar to areas 34 and 36) are formed.

Figure 3:
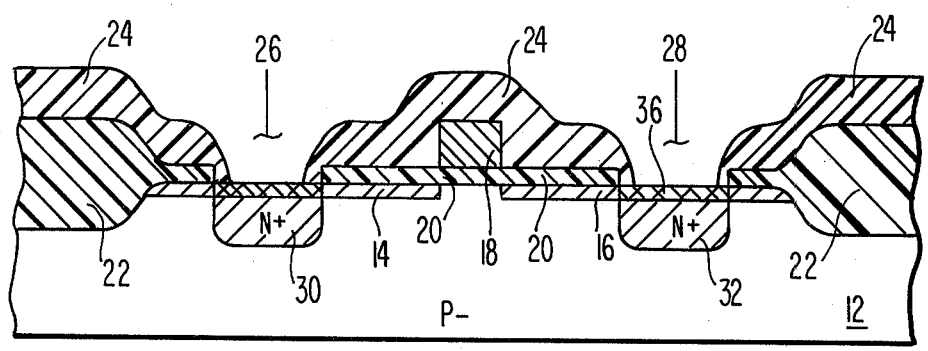

Referring now to FIG. 3, it will be seen that the next step in the process is to remove photoresist mask 38 (FIG. 2) and subject the structure to an etch. The etch may be conducted in a standard buffered hydrofluoric (BHF) solution for approximately one minute to remove any residual oxide that may have formed in the contact area. Additionally, the etch will also remove about 1000 angstroms of the now exposed CVD oxide layer 24 from the area previously covered with the photoresist during the deep contact ion implantation. Further, since the etch rate of the ion implanted CVD oxide areas 42 and 44 have an etch rate that is significantly greater than that of the non-implanted oxide layer 24 (due to the dopant concentration), this BHF etch will produce a slight taper at the upper edge of the contact opening.

Figure 4:
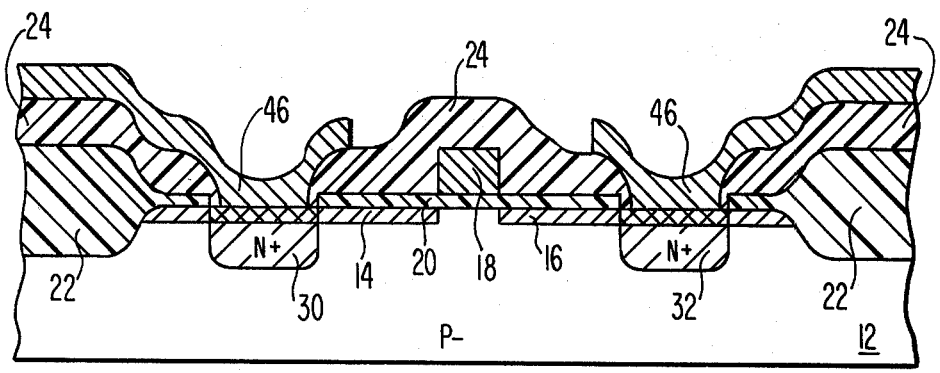

Thereafter, as shown in FIG. 3, the device is annealed at a temperature of about 850°–950° C. for a period of about 20–30 minutes which serve to activate implanted regions 30, 32, 34 and 36 and to produce a still more tapered area around the contact opening as a result of the flowing of the doped portions 42, 44 (FIG. 2). At this point a second BHF etch may be performed, for a short period of time, to remove any oxide that may have formed on the surface of the contact opening. In the next step, as shown in FIG. 4, the device is provided with a metallization layer that is subsequently masked and etched to define contacts 46 which are in direct ohmic contact with drain region 14 and source region 16.

Since the side walls of the contact openings are tapered, good metal step coverage is thus obtained. Further, the low energy shallow source and drain implanted regions provide a high surface doping concentration insuring good ohmic contact. Additionally, the high energy source and drain contact implantation produces deep junctions that allow good metal contact thereto without the prior art aluminum spiking.

What I claim is:

1. A process for forming low resistance metal contacts for a high density integrated circuit, the integrated circuit having shallow drain and source regions of a first conductivity type formed in a semiconductor body of a second conductivity type, a first oxide layer formed directly on the semiconductor body over the drain and source regions and a second oxide layer formed on the first oxide layer, comprising the steps of:
    forming first contact openings through the first and second layers, the openings aligned with respect to the drain and source regions to expose contact areas thereon;
    forming a layer of apertured masking material over the second oxide layer, the apertures of the masking material being in corresponding registry with and larger than the corresponding contact openings in the first and second oxide layers;
    implanting conductivity modifiers of the first conductivity type into both the exposed contact areas and into the unmasked regions of the second oxide layer surrounding the contact openings;
    removing the layer of apertured masking material;
    heating the semiconductor body to anneal any damage induced in the contact area and to flow the implanted unmasked regions of the second oxide layer surrounding the contact openings; and
    forming metal lines on the second oxide layer in direct ohmic contact with the contact areas of the drain and source diffused regions.

2. The process of claim 1, wherein the step of implanting conductivity modifiers comprises:
    implanting the first conductivity modifiers at an initial dose and an initial energy level; and
    implanting the first conductivity modifiers at a supplemental dose of about one half the initial dose and at a supplemental energy level lower than the initial energy level.

3. The process of claim 2, wherein:
    the first conductivity modifiers are implanted at an initial energy level of about 150 KeV and an initial dose of about $4 \times 10^{15}$ ions/cm$^2$; and
    the supplemental energy level ranges from about 75–80 KeV and the supplemental dose is about $3 \times 10^{15}$ ions/cm$^2$.

4. The process of claim 3, wherein:
    the heating step is conducted at a temperature ranging from about 850°–950° C. for a period of about 20–30 minutes.

5. The process of claim 4, comprising the further step of:
    etching the contact openings and oxide layers to remove any oxide formed on the contact areas.

6. The process of claim 5, comprising the further step of:
    depositing metallic contacts in the contact openings in direct ohmic contact with the contact area.

7. The process of claim 6, comprising the additional steps of:
    initially forming shallow drain and source regions of the second conductivity type in a first conductivity type well formed in the semiconductor body;
    forming second contact openings through the first and second layers, the openings aligned with respect to the second conductivity type drain and source regions to expose contact areas thereon;
    forming a second layer of apertured masking material over the second oxide layer and over the first contact openings, the apertures of the second masking material being in corresponding registry with and larger than the corresponding second contact openings;
    implanting conductivity modifiers of the second conductivity type into both the exposed contact areas and into the unmasked regions of the oxide layer surrounding the second contact openings; and
    removing the second layer of apertured masking material prior to the steps of heating the semiconductor body and forming the metal lines.

* * * * *